United States Patent
Kobayashi et al.

(10) Patent No.: US 7,187,024 B2
(45) Date of Patent: Mar. 6, 2007

(54) PIEZOELECTRIC ELEMENT, INK JET RECORDING HEAD AND METHOD FOR MANUFACTURING PIEZOELECTRIC ELEMENT

(75) Inventors: Motokazu Kobayashi, Kanagawa (JP); Makoto Kubota, Kanagawa (JP); Hisao Suzuki, Aichi (JP); Fumio Uchida, Osaka (JP); Chiemi Shimizu, Osaka (JP); Kenji Maeda, Gifu (JP)

(73) Assignees: Canon Kabushiki Kaisha, Tokyo (JP); Fuji Chemical Co. Ltd, Osaka (JP)

( * ) Notice: Subject to any disclaimer, the term of this patent is extended or adjusted under 35 U.S.C. 154(b) by 0 days.

(21) Appl. No.: 10/662,472

(22) Filed: Sep. 16, 2003

(65) Prior Publication Data

US 2004/0124482 A1 Jul. 1, 2004

(30) Foreign Application Priority Data

Sep. 20, 2002 (JP) .............................. 2002-275601

(51) Int. Cl.
*H01L 29/78* (2006.01)
(52) U.S. Cl. .................. 257/295; 257/310; 257/306
(58) Field of Classification Search ................ 257/295, 257/E29.164, 306, 310; 438/3
See application file for complete search history.

(56) References Cited

U.S. PATENT DOCUMENTS

| | | | |
|---|---|---|---|
| 5,500,988 A | 3/1996 | Moynihan et al. | |
| 5,650,362 A * | 7/1997 | Nashimoto | 427/126.3 |
| 5,995,359 A | 11/1999 | Klee et al. | |
| 5,998,819 A * | 12/1999 | Yokoyama et al. | 257/295 |
| 6,060,735 A * | 5/2000 | Izuha et al. | 257/295 |
| 6,315,853 B1 | 11/2001 | Kubota et al. | |
| 6,350,486 B2 * | 2/2002 | Sakamaki et al. | 427/100 |
| 6,398,349 B1 * | 6/2002 | Murai | 347/68 |

(Continued)

FOREIGN PATENT DOCUMENTS

| | | |
|---|---|---|
| EP | 0 689 249 A | 12/1995 |
| EP | 0 969 530 | 1/2000 |

(Continued)

OTHER PUBLICATIONS

Kumar, C., "Lead Zirconate Titanate Films by Rapid Thermal Processing," *Applied Physics Letters*, vol. 58, No. 11, Mar. 18, 1991, pp. 1161-1163.

(Continued)

*Primary Examiner*—Eugene Lee
(74) *Attorney, Agent, or Firm*—Fitzpatrick, Cella, Harper & Scinto

(57) ABSTRACT

In a piezoelectric element having a piezoelectric film sandwiched between a lower electrode and an upper electrode, the lower electrode and/or the upper electrode and the piezoelectric film comprise perovskite oxide and a contact interface between the lower electrode and/or the upper electrode and the piezoelectric film does not exist and a region where crystals of the lower electrode and/or the upper electrode and crystals of the piezoelectric film are mixed exists between the lower electrode and/or the upper electrode and the piezoelectric film.

6 Claims, 3 Drawing Sheets

U.S. PATENT DOCUMENTS

| | | |
|---|---|---|
| 6,402,302 B1 | 6/2002 | Ozaki et al. |
| 6,402,303 B1 * | 6/2002 | Sumi ........................... 347/68 |
| 6,822,302 B2 * | 11/2004 | Higuchi et al. ............. 257/410 |
| 6,824,898 B2 * | 11/2004 | Suzuki et al. ............... 428/701 |

FOREIGN PATENT DOCUMENTS

| | | |
|---|---|---|
| EP | 0 969 530 A | 1/2000 |
| JP | 9-92897 | 4/1997 |
| JP | 10-139594 | 5/1998 |
| JP | 10-290035 | 10/1998 |
| JP | 2000-79689 | 3/2000 |

OTHER PUBLICATIONS

*Rikagaku Jiten* (Dictionary of Science), 5$^{th}$ Ed.(Iwanami Shoten Co., publisher), 1998, p. 1268.

Eom et al., "Fabrication and Properties of Epitaxial Ferroelectric Heterostructures with ($SrRuO_3$) Isotropic Metallic Oxide Electrodes," Applied Physics Letters, vol. 63, No. 18, Nov. 1, 1993, pp. 2570-2572.

* cited by examiner

PIEZOELECTRIC ELEMENT, INK JET RECORDING HEAD AND METHOD FOR MANUFACTURING PIEZOELECTRIC ELEMENT

BACKGROUND OF THE INVENTION

1. Field of the Invention

The present invention relates to a piezoelectric element, an ink jet recording head using such a piezoelectric element and a method for manufacturing such a piezoelectric element.

2. Related Background Art

A piezoelectric element is constituted by piezoelectric ceramic having a ferro-dielectric or para-dielectric property. Composition of the piezoelectric ceramic is generally comprised of a two-component system mainly including titanic acid zirconium acidic lead (referred to as "PZT" hereinafter) or a three-component system in which a third component is added to PZT of the two-component system. The ferro-dielectric member using PZT of the two-component system is disclosed in "Applied Physics Letters", vol. 58, No. 11, pp 1161–1163, published on 1991.

As methods for manufacturing a ferro-dielectric film of metal oxide type, there are a spattering method, an MOCVD method, a sol-gel method and the like. The sol-gel method is a method in which solution including compound capable of performing hydrolysis of various component metals as raw material and partial hydrolysis substance or partial polycondensation substance thereof is coated on a substrate and the coating is dried and, thereafter, the substrate with the coating is heated in an air environment to form a metal oxide film and further the sintering is performed at a temperature greater than a crystallizing temperature of the metal oxide to crystallize the film, thereby forming a ferro-dielectric film. As the metal compound capable of performing the hydrolysis of the raw material, organic compound such as metal alkoxide, partial hydrolysis substance or partial polycondensation substance thereof is generally used. The Sol-gel method can form the ferro-dielectric film most easily in a most inexpensive manner. As a method similar to the sol-gel method, there is an organic metal decomposing method (MOD method). The MOD method is a method in which solution including thermally decomposable organic metal compound such as β-diketone complex or carboxylate is coated on a substrate and the substrate and the coating are heated in an air or oxygen environment, for example, to evaporate solvent in the coating and to thermally decompose the metal compound thereby to form a metal oxide film and the sintering is performed at a temperature greater than a crystallizing temperature to crystallize the film. In this specification, the sol-gel method, MOD method and a combination thereof are generically referred to as "sol-gel method". Further, a printer head of ink jet type utilizing a piezoelectric element formed by the sol-gel method is also disclosed. For example, in Japanese Patent Application Laid-Open Nos. H09-92897, H10-139594 and H10-290035, there is disclosed a method in which a piezoelectric film of a piezoelectric element used in a printer head of ink jet type by repeating the coating of sol including piezoelectric material onto a lower electrode and the heat treatment of the coating by several times.

Further, a method for manufacturing the piezoelectric element to improve a close contact ability by forming a mixture layer in which crystal structures are formed between an electrode and a piezoelectric film is disclosed (for example, refer to Japanese Patent Application Laid-Open No. 2000-79689).

As disclosed in the above-mentioned Japanese Patent Application Laid-Open Nos. H09-92897, H10-139594 and H10-290035, in the past, in order to enhance performance and endurance of the printer head of ink jet type, various techniques for enhancing a property and reliable operation of the piezoelectric element used as an actuator have been proposed. As a multi-crystal structure of the piezoelectric material by the sol-gel method, a columnar structure is known. The columnar structure is a structure in which grain boundary is formed substantially in perpendicular to a film thickness and a surface thereof certain unevenness in accordance with a grain size. This structure creates interfacial roughness between the structure and an upper electrode, which leads in increase in leak current and deterioration of a piezoelectric property. Further, in the conventional piezoelectric element, if noble metal such as Ru or Pt or oxide thereof is used as the lower electrode, due to out of alignment of the interface between the piezoelectric film and the lower electrode, there arises a problem regarding reduction in an electrical property, i.e. increase in leak current and in reduction in dielectric breakdown resistance. Further, if oxide of conductive perovskite type is used as the lower electrode, since the resistance value of the electrode is great in comparison with noble metal, there arises a problem regarding reduction in the property of the piezoelectric film, particularly reduction in a displacement amount. Further, in the method disclosed in the above-mentioned Japanese Patent Application Laid-Open No. 2000-79689, since the electrode does not have the perovskite structure, crystal in the piezoelectric film is disturbed at the interface between this film and the piezoelectric film having the perovskite structure, thereby deteriorating the property of the piezoelectric film.

SUMMARY OF THE INVENTION

A main object of the present invention is to provide a piezoelectric element in which alignment between a piezoelectric film and a lower electrode or an upper electrode is improved to provide good dielectric constant and a good electrical property, an ink jet recording head using such an element and a method for manufacturing such a piezoelectric element.

Another object of the present invention is to provide a piezoelectric element having a piezoelectric film sandwiched between a lower electrode and an upper electrode, in which the lower electrode and/or the upper electrode and the piezoelectric film comprise perovskite oxide and a contact interface between the lower electrode and/or the upper electrode and the piezoelectric film does not exist and a region where crystals of the lower electrode and/or the upper electrode and crystals of the piezoelectric film are mixed exists between the lower electrode and/or the upper electrode and the piezoelectric film. It is preferable that the mixed region also has a perovskite structure.

A further object of the present invention is to provide an ink jet recording head comprising a pressure chamber communicated with an ink discharge port, a vibrating plate provided in correspondence to the pressure chamber and a piezoelectric element having a piezoelectric film provided in correspondence to the vibrating plate and sandwiched between a lower electrode and an upper electrode, in which ink in the pressure chamber is discharged from the ink discharge port by a change of volume in the pressure chamber caused by the piezoelectric element, and in which the lower electrode and/or the upper electrode and the piezoelectric film comprise perovskite oxide and a contact interface between the lower electrode and/or the upper electrode and the piezoelectric film does not exist and a region where crystals of the lower electrode and/or the upper electrode and crystals of the piezoelectric film are mixed exists between the lower electrode and/or the upper electrode and the piezoelectric film.

A still further object of the present invention is to provide a method for manufacturing a piezoelectric element having a piezoelectric film sandwiched between a lower electrode and an upper electrode, which comprises a step for providing an electrode material for forming the lower electrode on a substrate, a step for drying the electrode material, a step for providing a piezoelectric material for forming the piezoelectric film on the electrode material, a step for drying the piezoelectric material and a step for sintering the electrode material and the piezoelectric material. Here, in the present invention, after the step for drying the electrode material and before the step for providing the piezoelectric material for forming the piezoelectric film on the electrode material, a step for sintering the electrode material is not carried out.

A further object of the present invention is to provide a method for manufacturing a piezoelectric element having a piezoelectric film sandwiched between a lower electrode and an upper electrode, which comprises a step for providing a piezoelectric material for forming the piezoelectric film on the lower electrode, a step for drying the piezoelectric material, a step for providing an electrode material for forming the upper electrode on the piezoelectric material, a step for drying the electrode material and a step for sintering the piezoelectric material and the electrode material. Here, in the present invention, after the step for drying the piezoelectric material and before the step for providing the electrode material for forming the upper electrode on the piezoelectric material, a step for sintering the piezoelectric material is not carried out.

The other object of the present invention is to provide a method for manufacturing a piezoelectric element in which at least an electrode and a piezoelectric film are laminated, which comprises a step for providing a laminated structure of an electrode material for forming the electrode before sintering and a piezoelectric material for forming the piezoelectric film before sintering and a step for sintering the laminated structure.

A further object of the present invention is to provide a piezoelectric element comprising a piezoelectric film sandwiched between a lower electrode and an upper electrode, wherein a contact interface between the lower electrode and/or said upper electrode and the piezoelectric film does not exist; and a region where crystals of the lower electrode and/or the upper electrode and crystals of the piezoelectric film are mixed exists between the lower electrode and/or the upper electrode and the piezoelectric film.

According to the present invention, since there is not a contact interface between the electrode and the piezoelectric film, a piezoelectric element in which residual polarization is great and great displacement can be achieved, an ink jet recording head using such an element and a method for manufacturing such an element can be provided.

DESCRIPTION OF THE PREFERRED EMBODIMENTS

Figure 1:
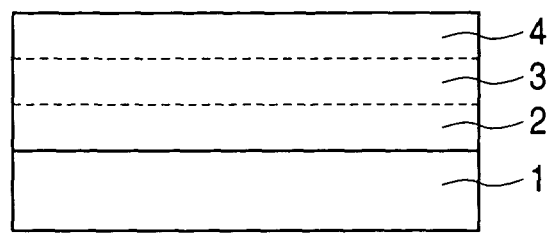
FIG. 1 is a sectional view schematically showing a piezoelectric element of the present invention.

Now, embodiments of the present invention will be explained. FIG. 1 is a view showing a piezoelectric element according to an embodiment of the present invention. In FIG. 1, a substrate 1 is shown. As the substrate, although a semiconductor substrate made of silicon (Si) or tungsten (W) is preferably used, ceramic such as zirconia, alumina or silica may be used. Further, a multi-layer structure in which ceramic is laminated on a silicon substrate or a metal layer such as platinum or palladium is laminated on a silicon substrate may be used.

In FIG. 1, a lower electrode 2 and an upper electrode 4 are also shown. In the present invention, the electrodes have a thickness of about 5 to 500 nm and are made of conductive perovskite oxide manufactured by a sol-gel method. As the conductive perovskite oxide, various perovskite oxides presenting metallic conductivity can be used. Preferably, $M^1RuO_3$ ($M^1$ shows at least one kind selected from Sr, Ba and Ca) or $Sr_{(1-x)}M^2_{(x)}CoO_3$ ($M^2$ shows at least one kind selected from La, Pr, Sm and Nd; and $0 \leq x < 1$) can be listed up.

Incidentally, the perovskite oxide is oxide ideally having a perovskite structure as cubic crystal structure, as described in a document "Rikagaku Jiten" (published by IWANAMI Shoten). Such oxide is manufactured by the sol-gel method. That is to say, the oxide can be obtained by a technique in which, after metal compound having hydrolysis property is dissolved in a solvent, hydrolysis is executed by adding water to obtain coating liquid, and the coating liquid is coated on a substrate and then is dried and, thereafter, sintering is performed by heat treatment. As the solvent used, there are alcohol solvent such as methanol, ethanol, n-butanol, n-propanol or isopropanol, ether solvent such as tetrahydrofuran or 1,4-dioxisane, Cellosolve solvent such as methyl Cellosolve or ethyl Cellosolve, amide solvent such as N,N-dimethyl formamide, N,N-dimethyl acetamide or N-methyl pyrrolidone and nitrile solvent such as acetnitrile. Among them, the alcohol solvent is preferable. An amount of the solvent used in the sol-gel method in the present invention is normally 10 times mole to 200 times mole and preferably 20 times mole to 100 times mole. If the amount of the solvent is too great, gel is hard to occur; whereas, if the amount is too small, great heat is generated during the hydrolysis.

The perovskite oxide $M^1RuO_3$ ($M^1$ indicates at least one kind selected from Sr, Ba and Ca) is synthesized from a solution of ruthenium alkoxide or a ruthenium compound and an $M^1$ metal compound by the sol-gel method. As the ruthenium compound, there are various alkoxides or ruthenium compounds such as acetyl acetone ruthenium, tris (2,2,6,6-tetramethyl-3,5-heptanedianato) ruthenium, ruthenium oxide hydrate, ruthenium methoxide, ruthenium ethoxide, ruthenium hydroxide and alkyl substitutions thereof. Further, various carboxylates, hydroxy carboxylates or acetylacetonate complexes such as inorganic salt compounds of ruthenium (more specifically, chloride, nitrate, phosphate and sulfate) or organic salt compounds (more specifically, formate, acetate, propionic acid salt, oxalate, citric acid salt and malic acid salt) may be mixed with a solvent to synthesize alkoxide in situ.

Further, in order to perform hydrolysis of the solution including hydrolysis metal compound and/or metal salt, water of 0.05 mole time to 2 mole times, more preferably 0.5 mole time to 1.5 mole times of the hydrolysis metal compound (for example, metal alkoxide) and/or metal salt is used. In the hydrolysis, acid catalyst and/or base catalyst may be used, and, preferably, mineral acid such as hydrochloric acid or organic acid such as acetic acid is used. As hydrolysis metal compounds of $M^1$ metal, compounds similar to the ruthenium can be used. $Sr_{(1-x)}M^2_{(x)}CoO_3$ ($M^2$ shows at least one kind selected from La, Pr, Sm and Nd; and 0<x<1) is also manufactured similarly from hydrolysis metal compound of Sr, hydrolysis metal compound of $M^2$ or hydrolysis metal compound of Co.

In case of the lower electrode, the coating liquid is coated on the substrate and is dried, and, in case of the upper electrode, the coating liquid is coated on a piezoelectric film which will be described later and is dried. As a coating method, a well-known coating method such as spin coat, dip coat, bar coat or spray coat can be used. Further, plural coating operations and drying operations may be carried out. Although a film thickness per one layer after the drying is not particularly limited, such a thickness is preferably 0.01 μm to 0.5 μm. The kinds and thicknesses of the lower electrode and the upper electrode may be the same or different.

In FIG. 1, a piezoelectric thin film or film 3 is also shown. In the present invention, a substance represented by $Pb_{(1-x)}La_x(Zr_yTi_{1-y})O_3$ (in the formula, $0 \leq x < 1$, $0 \leq y \leq 1$) (PLZT or PZT) is manufactured by the sol-gel method and it is used. That is to say, the piezoelectric film can be obtained by a technique in which, after hydrolysis compound (for example, metal alkoxide) of Pb, La, Zr or Ti and/or hydroxide is dissolved in solvent, water is added to perform hydrolysis thereby to obtain the coating liquid and the coating liquid is coated on the substrate and then is dried and thereafter sintering is performed by heat treatment. As the solvent used, there are alcohol solvent such as methanol, ethanol, n-butanol, n-propanol or isopropanol, ether solvent such as tetrahydrofuran or 1,4-dioxisane, Cellosolve solvent such as methyl Cellosolve or ethyl Cellosolve, amide solvent such as N,N-dimethyl formamide, N,N-dimethyl acetamide or N-methyl pyrrolidone and nitrile solvent such as acetnitrile. Among them, the alcohol solvent is preferable.

An amount of the solvent used in the sol-gel method in the present invention is normally 10 times mole to 200 times mole and preferably 20 times mole to 100 times mole. If the amount of the solvent is too great, gel is hard to occur; whereas, if the amount is too small, great heat is generated during the hydrolysis. Further, as alkoxide compounds of Pb, there are other various alkoxides such as lead 2-ethoxy ethoxide, lead methoxide, lead ethoxide, lead n-propoxide, lead i-propoxide, lead n-butoxide, lead i-butoxide, lead t-butoxide and lead hydroxide, and alkyl substitutions and hydrolysis lead compounds thereof. Further, various carboxylates, hydroxy carboxylates or acetylacetonate complexes such as inorganic salt compounds of lead (more specifically, chloride, nitrate, phosphate and sulfate) or organic salt compounds (more specifically, formate, acetate, propionic acid salt, oxalate, citric acid salt and malic acid salt) may be mixed with solvent to synthesize alkoxide in situ. Regarding La, Zr and Ti, similar alkoxide compound or inorganic salt can be used. Alkoxide solution or inorganic salt of Pb, La, Zr or Ti is dissolved in the solvent and the hydrolysis is performed to achieve polymerization, thereby obtaining the piezoelectric film.

Although the feeding ratio of the above-mentioned metals may be $Pb_{(1-x)}La_x(Zr_yTi_{1-y})O_3$ (in the formula, $0 \leq x < 1$, $0 \leq y \leq 1$), since Pb is lost during the sintering in the film formation, it is preferable that an amount of Pb is previously increased during the manufacture of the coating liquid. More specifically, in $Pb_{(1-x)}La_x(Zr_yTi_{1-y})O_3$ (in the formula, $0 \leq x < 1$, $0 \leq y \leq 1$), mole ratio of Pb may be increased within a range of 5% to 30%. Further, in order to perform hydrolysis of the solution including metal alkoxide and/or metal salt, water of 0.05 mole time to 2 mole times, more preferably 0.5 mole time to 1.5 mole times of the metal alkoxide) and/or metal salt is used. In the hydrolysis, acid catalyst and/or base catalyst may be used, and, preferably, mineral acid such as hydrochloric acid or organic acid such as acetic acid is used.

The coating liquid is coated on the lower electrode and is dried. As a method, a well-known coating method such as spin coat, dip coat, bar coat or spray coat can be used. Further, plural coating operations and drying operations may be carried out. Although a film thickness per one layer after the drying is not particularly limited, such a thickness is preferably 0.01 μm to 0.5 μm. Further, a total thickness is preferably about 1 μm to 30 μm.

Now, a method for manufacturing the piezoelectric element according to the present invention will be explained. The coating liquid manufactured by the sol-gel method is coated on the substrate to form the lower electrode. The coating method is not particularly limited, but, dip coat, spin coat or bar coat can be used. After the coating, the lower electrode is dried. In this case, although the temperature differs in dependence upon the kind of the solvent included, about 100° C. to 300° C. is preferable. Further, if the thickness of the electrode is desired to be increased, the coating operations and the drying operations may be repeated to form a laminated structure. Further, the sintering is performed to make the electrode to a perovskite structure. The sintering may be performed in an inert gas atmosphere, an oxygen-including atmosphere (in air) or any other atmosphere and may be performed under normal pressure or reduced pressure. Normally, the sintering is performed in the air for several minutes to 24 hours by increasing the temperature from a room temperature to a temperature of about 300° C. to 850° C. Further, in the sintering operation, the temperature may be increased steppingly. By such sintering, organic components are almost lost, thereby obtaining the electrode having a fine structure. However, at least an uppermost layer of the electrode is burned after the piezoelectric film is formed on this layer. In this case, the electrode coating liquid and the piezoelectric element coating liquid may be mixed and used.

The piezoelectric film is formed on an upper part of the electrode formed in this way. The piezoelectric film is formed by performing coating, drying and sintering on the electrode layer after the piezoelectric film coating liquid was dried. In this case, the piezoelectric film coating liquid permeates into the vicinity of the surface of the electrode layer. Further, by drying and sintering the piezoelectric film, crystals in the electrode layer and crystals in the piezoelectric film are grown in a mixed manner at a contact interface therebetween thereby to substantially disappear the interface.

The sintering may be performed in any atmosphere such as an inert gas atmosphere, an oxygen-including atmosphere (in air) or a PbO atmosphere and may be performed under normal pressure or reduced pressure. Normally, the sintering is performed in the air for several minutes to 24 hours by increasing the temperature from a room temperature to a temperature of about 300° C. to 850° C. Further, in the sintering operation, the temperature may be increased steppingly. By such sintering, organic components are almost lost, thereby obtaining the electrode having a fine structure.

The upper electrode is formed on the piezoelectric film in a similar manner to the lower electrode. That is to say, the upper electrode is formed by performing the coating, drying and sintering on at least an uppermost layer of the piezoelectric film after the uppermost layer was dried. In this case, the upper electrode coating liquid permeates into the vicinity of the surface of the piezoelectric film. Further, by drying and sintering the upper electrode, crystals in the electrode layer and crystals in the piezoelectric film are grown in a mixed manner at a contact interface therebetween thereby to substantially disappear the interface (broken lines between 2 and 3 and between 3 and 4 in FIG. 1). The disappearance of the interface means that, when the contact interface between the piezoelectric film and the electrode is observed by an electron microscope (SEM) or a transmission microscope (TEM), the interface cannot be ascertained clearly. This means that, in the piezoelectric element having the piezoelectric film sandwiched between the lower electrode and the upper electrode, the lower electrode, upper electrode and piezoelectric film are formed from perovskite oxide and layers in which crystals in the electrode and crystals in the piezoelectric film are mixed exist in joint surfaces between the lower and upper electrodes and the piezoelectric film. By disappearing the interfaces between the piezoelectric film and the electrodes substantially by means of the manufacturing method of the present invention in this way, a piezoelectric element in which interfacial alignment between the piezoelectric film and the lower electrode or the upper electrode is enhanced and good dielectric constant and good electrical property are maintained can be obtained.

Incidentally, the term "drying" in this specification means a step for removing solvent from the film obtained by coating the coating liquid. In the drying, although the formation of the metal oxide is partially advanced, the crystal of the metal oxide as the target material is obtained by a "sintering" step using high temperature heating.

Figure 2:
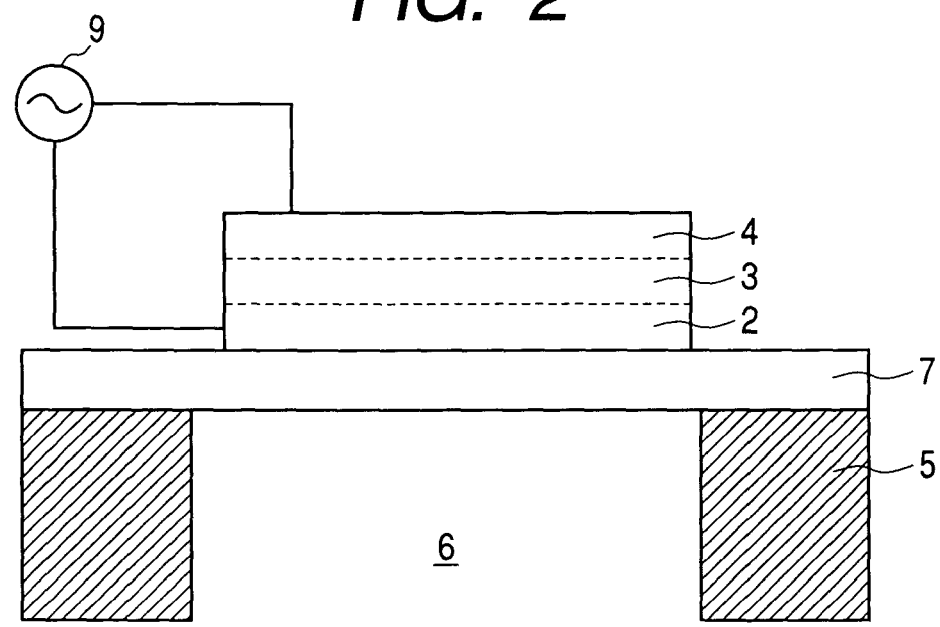
FIG. 2 is a sectional view schematically showing a condition that the piezoelectric element of the present invention is used as an actuator of an ink jet printer head.

FIG. 2 shows an example of an aspect of the present invention, schematically showing a part of an ink jet printer head using the piezoelectric element as an actuator in an enlarged scale. A fundamental construction of the printer head is the same as conventional heads and comprises a head base 5, a vibrating plate 7 and a piezoelectric element. The head base 5 is provided with a plurality of ink nozzles (not shown) for discharging ink, a plurality of ink paths (not shown) communicated with the respective ink nozzles and a plurality of ink chambers 6 communicated with the respective ink paths. The vibrating plate 7 is attached to cover the entire upper surface of the head base 5 so that upper openings of the ink chambers 6 of the head base 5 are closed by the vibrating plate 7. The vibrating plate 7 is provided with piezoelectric elements 8 adapted to provide a vibrating drive force to the vibrating plate 7 and located at positions corresponding to the respective ink chambers 6. By controlling a power supply 9, by applying voltage to a desired piezoelectric element 8 selected from the plural piezoelectric elements 8, the piezoelectric element 8 is displaced, thereby vibrating a part of the vibrating plate 7 associated with the piezoelectric element. As a result, a volume of the ink chamber 6 corresponding to the vibration of the vibrating plate 7 is changed, with the result that the ink is discharged from the corresponding ink nozzle through the corresponding ink path, thereby performing the print.

EMBODIMENT

Now, more concrete embodiments of the present invention will be explained. As the coating liquid for forming the electrode, coating liquids having composition of $SrRuO_3$ and $Sr_{0.5}La_{0.5}CoO_3$ were manufactured.

(Manufacture of $SrRuO_3$ Coating Liquid)—Liquid A

Strontium 2,4 pentane dionate and ruthenium 2,4 pentane dionate having composition corresponding to $SrRuO_3$ were thermally dissolved in 2-methoxy ethanol. Hydrolysis was performed by using dilute hydrochloric acid to obtain 10% (oxide conversion density) coating liquid of $SrRuO_3$.

(Manufacture of $Sr_{0.5}La_{0.5}CoO_3$ Coating Liquid)—Liquid B

Strontium 2,4 pentane dionate, lanthanum isopropoxide and cobalt 2,4 pentane dionate having composition corresponding to $Sr_{0.5}La_{0.5}CoO_3$ were thermally dissolved in isopropyl alcohol. Hydrolysis was performed by using dilute hydrochloric acid to obtain 10% (oxide conversion density) coating liquid of $Sr_{0.5}La_{0.5}CoO_3$. As the coating liquid for the piezoelectric film, coating liquid having metal composition of $Pb_{1.1}La_{0.01}Zr_{0.52}Ti_{0.48}$ were manufactured.

(Manufacture of Coating Liquid Having Metal Composition of $Pb_{1.1}La_{0.01}Zr_{0.52}Ti_{0.48}$)—Liquid C Lead acetate, lanthanum isoproxide, zirconium butoxide and titanium isoproxide having composition corresponding to $Pb_{1.1}La_{0.01}Zr_{0.52}Ti_{0.48}$ were thermally dissolved in 2-methoxy ethanol. Hydrolysis was performed by using dilute hydrochloric acid to obtain 10% (oxide conversion density) coating liquid of $Pb_{1.1}La_{0.01}Zr_{0.52}Ti_{0.48}$. Further, the following commercially available PZT coating liquid was used.

PZT Film Forming Agent (A6) Manufactured by Mitsubishi Material Co., Ltd.—Liquid D The piezoelectric element and the method for manufacturing the piezoelectric element are shown in the following embodiments 1 to 6.

Embodiment 1

Figure 3:
FIG. 3 is a perspective view schematically showing a substrate used in embodiments 1 to 6 and comparative examples 1 and 2.
Figure 4:
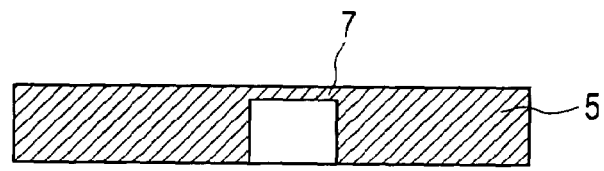
FIG. 4 is a sectional view schematically showing the substrate used in the embodiments 1 to 6 and the comparative examples 1 and 2.

The Liquid A was coated as the lower electrode, by a spin coater, on a surface of a zirconia substrate in which a rear surface is partially drilled, as shown in FIGS. 3 and 4. After the drying was performed by a hot plate having a temperature of 100° C. for 5 minutes, the film thickness was 10 nm. The Liquid D was similarly coated by the spin coater as the piezoelectric film. After the drying at a temperature of 100° C. for 5 minutes, the sintering was performed in an electric furnace having a temperature of 700° C. for 10 minutes. The film thickness was 0.1 μm. Further, after the repeating the coating, drying and sintering of the Liquid D by 10 times, the Liquid D was coated and dried. The total thickness of the piezoelectric element was 1 μm.

Figure 5:
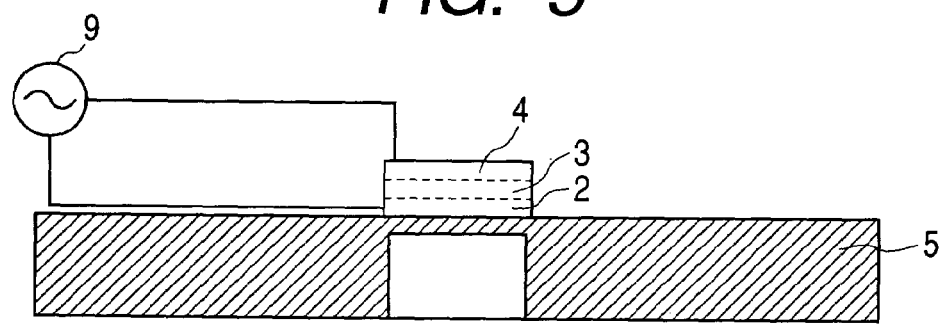
FIG. 5 is a sectional view schematically showing the piezoelectric element manufactured in the embodiments 1 to 6 and the comparative examples 1 and 2.

After the Liquid A was coated thereon and was dried, the sintering was performed in the electric furnace having a temperature of 700° C. for 10 minutes to obtain the piezoelectric element of the present invention (FIG. 5). By analyzing metal composition of an intermediate portion of the piezoelectric film, it was found that the composition was $Pb_{1.0}Zr_{0.52}Ti_{0.48}$.

Embodiment 2

The Liquid A was coated on the substrate similar to the embodiment 1 by a spin coater as the lower electrode. After the drying was performed by a hot plate having a temperature of 100° C. for 5 minutes, the sintering was performed at a temperature of 500° C. for 10 minutes. Further, the Liquid A was coated by the spin coater. After the drying was performed by the hot plate having a temperature of 100° C. for 5 minutes, the thickness of the lower electrode in this case was 20 nm. Further, the Liquid D was similarly coated as the piezoelectric film by the spin coater. After the drying at the temperature of 100° C. for 5 minutes, the sintering was performed in the electric furnace having a temperature of 700° C. for 10 minutes. Further, the coating, drying and sintering of the Liquid D were repeated by 10 times. The thickness of the piezoelectric element in this case was 1 μm. Further, the Liquid D was coated and dried. After the Liquid A was coated thereon and was dried, the sintering was performed in the electric furnace having the temperature of 700° C. for 10 minutes. Further, after the Liquid A was coated and dried, the sintering was performed at a temperature of 500° C. for 10 minutes. By analyzing metal composition of an intermediate portion of the piezoelectric film, it was found that the composition was $Pb_{1.0}Zr_{0.52}Ti_{0.48}$.

Embodiment 3

The Liquid B was coated on the surface of the substrate similar to the embodiment 1 by a spin coater as the lower electrode. After the drying was performed by a hot plate having a temperature of 100° C. for 5 minutes, the Liquid C as the piezoelectric film was similarly coated by the spin coater. After the drying at the temperature of 100° C. for 5 minutes, the sintering was performed in the electric furnace having a temperature of 700° C. for 10 minutes. Further, after the coating, drying and sintering of the Liquid C were repeated by 15 times, the Liquid C was coated and dried. After the Liquid B was coated thereon and was dried, the sintering was performed in the electric furnace having the temperature of 700° C. for 10 minutes to obtain the piezoelectric element of the present invention. By analyzing metal composition of an intermediate portion of the piezoelectric film, it was found that the composition was $Pb_{0.99}La_{0.01}Zr_{0.52}Ti_{0.48}$.

Embodiment 4

The Liquid B was coated on the surface of the substrate similar to the embodiment 1 by a spin coater as the lower electrode. After the drying was performed by the hot plate having a temperature of 100° C. for 5 minutes, the sintering was performed at a temperature of 500° C. for 10 minutes. Further, the Liquid B was coated by the spin coater. After the drying was performed by the hot plate having a temperature of 100° C. for 5 minutes, the Liquid C was coated similarly by the spin coater as the piezoelectric film. After the drying at the temperature of 100° C. for 5 minutes, the sintering was performed in the electric furnace having a temperature of 700° C. for 10 minutes. Further, after the coating, drying and sintering of the Liquid C were repeated by 10 times, the Liquid C was coated and dried. After the Liquid B was coated thereon and was dried, the sintering was performed in the electric furnace having the temperature of 700° C. for 10 minutes. Further, after the Liquid B was coated and dried, the sintering was performed at the temperature of 500° C. for 10 minutes to obtain the piezoelectric element of the present invention. By analyzing metal composition of an intermediate portion of the piezoelectric film, it was found that the composition was $Pb_{0.99}La_{0.01}Zr_{0.52}Ti_{0.48}$.

Embodiment 5

The piezoelectric element was manufactured similarly to the embodiment 1, except that the substrate was changed from the zirconia substrate to a silicon wafer (FIG. 5).

Embodiment 6

In the embodiment 1, platinum having a thickness of 0.2 μm was laminated on the zirconia substrate and the substrate with platinum was used. The others were manufactured similarly.

COMPARATIVE EXAMPLE 1

The Liquid A was coated on the surface of the substrate similar to the embodiment 1 by a spin coater as the lower electrode. After the drying was performed by the hot plate having a temperature of 100° C. for 5 minutes, the sintering was performed at a temperature of 500° C. for 10 minutes. The Liquid D as the piezoelectric film was similarly coated thereon by the spin coater. After the drying at the temperature of 100° C. for 5 minutes, the sintering was performed in an electric furnace having a temperature of 700° C. for 10 minutes. Further, the coating, drying and sintering of the Liquid D were repeated by 11 times. Lastly, after the Liquid A was coated and dried, the sintering was performed in the electric furnace having the temperature of 700° C. for 10 minutes to obtain a piezoelectric element. By analyzing metal composition of an intermediate portion of the piezoelectric film, it was found that the composition was $Pb_{1.0}Zr_{0.52}Ti_{0.48}$.

COMPARATIVE EXAMPLE 2

The Liquid B was coated on the surface of the substrate similar to the embodiment 1 by a spin coater as the lower electrode. After the drying was performed by the hot plate having a temperature of 100 ° C. for 5 minutes, the sintering was performed at a temperature of 500° C. for 10 minutes. The Liquid C as the piezoelectric film was similarly coated thereon by the spin coater. After the drying at the temperature of 100° C. for 5 minutes, the sintering was performed in an electric furnace having a temperature of 700° C. for 10 minutes. Further, the coating, drying and sintering of the Liquid C were repeated by 16 times. Lastly, after the Liquid B was coated and dried, the sintering was performed in the electric furnace having the temperature of 700° C. for 10 minutes to obtain a piezoelectric element. By analyzing metal composition of an intermediate portion of the piezoelectric film, it was found that the composition was $Pb_{0.99}La_{0.01}Zr_{0.52}Ti_{0.48}$.

<Evaluation>

The embodiments 1 to 6 and the comparative examples 1 and 2 were evaluated as follows. The section from the upper electrode to the lower electrode was observed by a transmission microscope (TEM) to check the structure of the contact interface between the electrodes and the piezoelectric film. Further, it was checked whether there is the perovskite structure by an X-ray diffraction device. Further, a displacement amount was measured by a laser Doppler method while applying alternate current of 10 kHz and 10 V, thereby evaluating a property as the piezoelectric element. Results are shown in the following Table 1. From the Table 1, it can be seen that, the displacement amounts are great in comparison with the comparative examples and that the piezoelectric elements of the embodiments are operated well after the endurance test of 720 hours.

TABLE 1

| | TEM observation | X-ray observation | initial displacement amount (μm) | displacement after operation of 720 hours (μm) |
|---|---|---|---|---|
| Embodiment 1 | no interface | None | 2.2 | 2.1 |
| Embodiment 2 | no interface | None | 2.4 | 2.2 |
| Embodiment 3 | no interface | None | 1.9 | 1.7 |
| Embodiment 4 | no interface | None | 2.0 | 1.9 |
| Embodiment 5 | no interface | None | 2.1 | 2.0 |
| Embodiment 6 | no interface | None | 2.1 | 2.1 |
| Comparative example 1 | no interface | None | 1.2 | 0.8 |
| Comparative example 2 | no interface | None | 1.0 | 0.7 |

In "x-ray observation", "none" shows that a peak indicating crystal structure other than perovskite structure was not observed in upper electrode, lower electrode, piezoelectric film or interfaces thereof.

Figure 6:
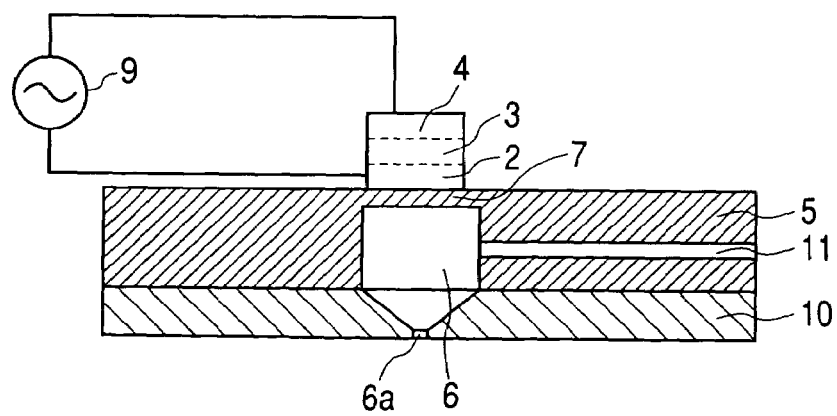
FIG. 6 is a sectional view schematically showing a head used in evaluation of an ink jet recording head.
Figure 7:
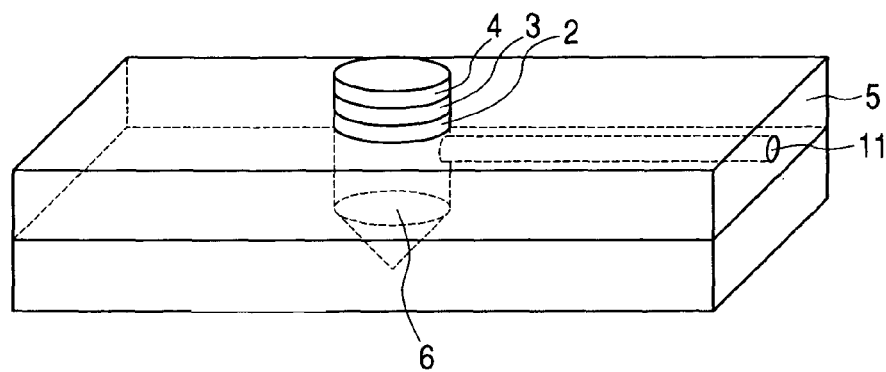
FIG. 7 is a perspective view schematically showing the head used in the evaluation of the ink jet recording head.

A nozzle plate 10 including a nozzle 6a as shown in FIGS. 6 and 7 was attached to each of the elements manufactured in the embodiments 1 to 6 and the comparative examples 1 and 2 and further an introduction path 11 for introducing ink was provided to form an ink jet recording head. In order to evaluate the ink jet recording head, ink jet ink was introduced into the ink jet recording head manufactured as mentioned above through the introduction path 11 to fill an ink chamber 6. Then, alternative current of 20 kHz and 10 V was applied between the upper electrode and the lower electrode and a state of ink discharging was observed by a microscope. As a result, in the embodiments 1 to 6, an ink droplet could be discharged in response to each frequency. On the other hand, in the comparative examples 1 and 2, the ink droplet could not be discharged uniformly between 15 kHz and 20 kHz.

<Other Evaluation>

Figure 8:
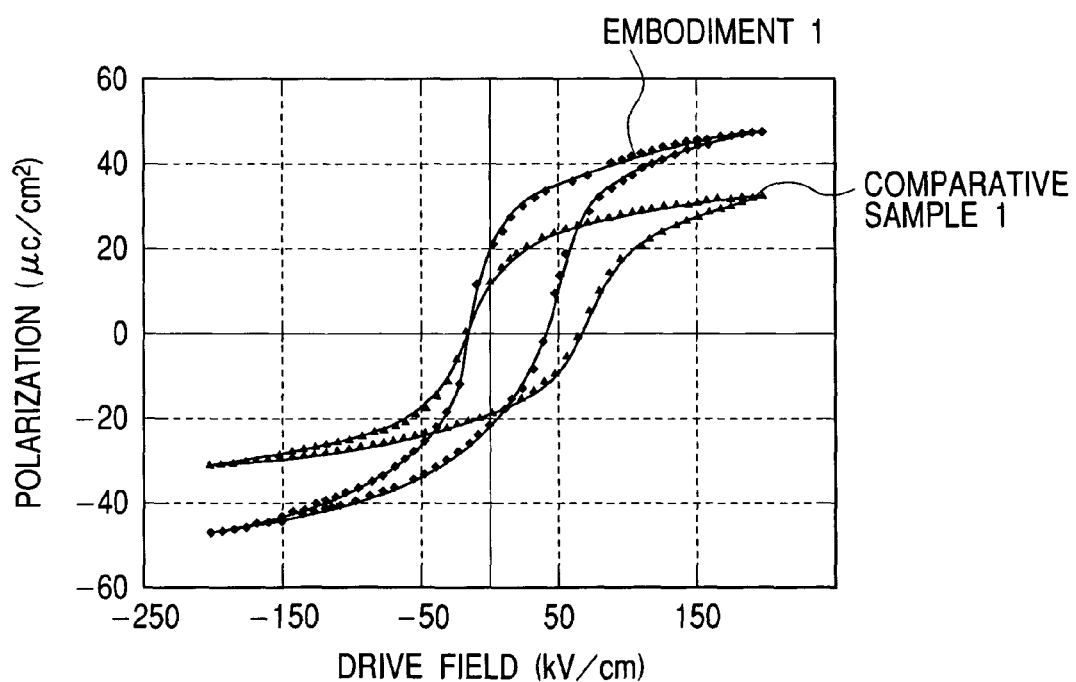
FIG. 8 is a view showing hysteresis curves in the embodiment 1 and the comparative example 1.

A polarization property of applied electric field in each of the piezoelectric elements manufactured in the embodiment 1 and the comparative example 1 was measured. In the measurement, voltage of 20 V was applied to the element by using HVS-6000 manufactured by Radiants to obtain a hysteresis curve. Such curves are shown in FIG. 8. From FIG. 8, it can be seen that the embodiment 1 has residual polarization greater than the comparative example 1. Since such remarkable hysteresis property can be used in a storing element, by arranging plural elements side by side so that voltage can be applied to each element independently, the arrangement can be used as a memory. That is to say, by performing the writing by supplying drive signals in response to information to be stored, and by performing the reading by detecting a polarization direction, the arrangement can be used as a rewritable memory. In a case where the piezoelectric elements are used as such a memory, the film thickness is preferably 0.1 μm to 2 μm.

As mentioned above, the piezoelectric element manufactured in accordance with the present invention can be used as devices such as a memory, a condenser, a sensor, a light modulating device and the like, as well as the piezoelectric element of the ink jet recording head.

What is claimed is:

1. A piezoelectric element comprising:
   a piezoelectric film sandwiched between a lower electrode and an upper electrode,
   wherein said lower electrode is formed of a first material, said piezoelectric film is formed of a second material, and said upper electrode is formed of a third material,
   wherein said lower electrode and/or said upper electrode and said piezoelectric film comprise perovskite oxide,
   wherein an interface between said lower electrode and/or said upper electrode and said piezoelectric film does not exist, and
   wherein (i) a region containing crystals of said first material and crystals of said second material exists between said lower electrode and said piezoelectric film, and/or (ii) a region containing crystals of said second material and crystals of said third material exists between said piezoelectric film and said upper electrode.

2. A piezoelectric element according to claim 1, wherein each of said regions has a perovskite structure.

3. A piezoelectric element according to claim 1, wherein said lower electrode, said upper electrode and said piezoelectric film comprise perovskite oxide manufactured by a sol-gel method.

4. A piezoelectric element according to claim 1, wherein each of said lower electrode and said upper electrode comprises a material represented by a general formula $M^1RuO_3$ ($M^1$ indicates at least one kind selected from Sr, Ba and Ca) or $Sr_{(1-x)}M^2_{(x)}CoO_3$ ($M^2$ indicates at least one kind selected from La, Pr, Sm and Nd; and $0 \leq x < 1$) and said piezoelectric film comprises a material represented by a general formula $Pb_{(1-x)}La_x(Zr_yTi_{1-y})O_3$ ($0 \leq x < 1$, $0 \leq y \leq 1$).

5. An ink jet recording head comprising:
   a pressure chamber communicated with an ink discharge port;
   a vibrating plate provided in correspondence to said pressure chamber; and
   a piezoelectric element provided in correspondence to said vibrating plate and having a piezoelectric film sandwiched between a lower electrode and an upper electrode,
   wherein ink in said pressure chamber is discharged from said ink discharge port by a change of volume in said pressure chamber caused by said piezoelectric element,
   wherein said lower electrode is formed of a first material, said piezoelectric film is formed of a second material, and said upper electrode is formed of a third material,
   wherein said lower electrode and/or said upper electrode and said piezoelectric film comprise perovskite oxide,
   wherein an interface between said lower electrode and/or said upper electrode and said piezoelectric film does not exist, and
   wherein (i) a region containing crystals of said first material and crystals of said second material exists between said lower electrode and said piezoelectric film, and/or (ii) a region containing crystals of said second material and crystals of said third material exists between said piezoelectric film and said upper electrode.

6. A piezoelectric element comprising a piezoelectric film sandwiched between a lower electrode and an upper electrode, wherein said lower electrode is formed of a first material, said piezoelectric film is formed of a second material, and said upper electrode is formed of a third material, wherein an interface between said lower electrode and/or said upper electrode and said piezoelectric film does not exist, and wherein (i) a region containing crystals of said first material and crystals of said second material exists between said lower electrode and said piezoelectric film, and/or (ii) a region containing crystals of said second material and crystals of said third material exists between said piezoelectric film and said upper electrode.

* * * * *

UNITED STATES PATENT AND TRADEMARK OFFICE
CERTIFICATE OF CORRECTION

PATENT NO. : 7,187,024 B2
APPLICATION NO. : 10/662472
DATED : March 6, 2007
INVENTOR(S) : Motokazu Kobayashi et al.

It is certified that error appears in the above-identified patent and that said Letters Patent is hereby corrected as shown below:

COLUMN 1
　　　　Line 24, "on" should read --in--.

COLUMN 2
　　　　Line 14, "certain" should read --with certain--.
　　　　Line 20, "out of align-" should read --misalign- --.
　　　　Line 58, "has" should read --have--.

COLUMN 4
　　　　Line 39, "$M_1RuO_3$" should read --$M^1RuO_3$--.
　　　　Line 58, "acitnitrile." should read --acetonitrile.--.

COLUMN 6
　　　　Line 17, "is" (second occurrence) should read --be--.
　　　　Line 48, "make the electrode to" should read --give the electrode--.

COLUMN 7
　　　　Line 5, "disappear" should read --erase--.
　　　　Line 27, "disappear" should read --erase--.

COLUMN 8
　　　　Line 64, "the" (first occurrence) should be deleted.
　　　　Line 65, "by" should be deleted.

COLUMN 9
　　　　Line 24, "by" should be deleted.
　　　　Line 46, "by" should be deleted.

UNITED STATES PATENT AND TRADEMARK OFFICE
CERTIFICATE OF CORRECTION

PATENT NO. : 7,187,024 B2
APPLICATION NO. : 10/662472
DATED : March 6, 2007
INVENTOR(S) : Motokazu Kobayashi et al.

It is certified that error appears in the above-identified patent and that said Letters Patent is hereby corrected as shown below:

COLUMN 10
    Line 2, "by" should be deleted.
    Line 37, "by" should be deleted.
    Line 57, "by" should be deleted.

COLUMN 11
    Line 42, "alternative" should read --alternating--.

Signed and Sealed this

Third Day of June, 2008

JON W. DUDAS
*Director of the United States Patent and Trademark Office*